(12) United States Patent
Boerstler et al.

(10) Patent No.: US 7,420,400 B2
(45) Date of Patent: Sep. 2, 2008

(54) METHOD AND APPARATUS FOR ON-CHIP DUTY CYCLE MEASUREMENT

(75) Inventors: David William Boerstler, Round Rock, TX (US); Eskinder Hailu, Austin, TX (US); Jieming Qi, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 164 days.

(21) Appl. No.: 11/380,982

(22) Filed: May 1, 2006

(65) Prior Publication Data

US 2007/0255517 A1 Nov. 1, 2007

(51) Int. Cl.
*H03K 3/017* (2006.01)

(52) U.S. Cl. ............................ 327/175; 327/35; 327/36; 714/744

(58) Field of Classification Search ................. None
See application file for complete search history.

(56) References Cited

U.S. PATENT DOCUMENTS

| | | | |
|---|---|---|---|
| 4,552,118 A | 11/1985 | Fukaya | |
| 4,675,597 A | 6/1987 | Hernandez | |
| 4,814,872 A | 3/1989 | Ivie | |
| 4,859,944 A | 8/1989 | Webb | |
| 4,962,431 A | 10/1990 | Imakawa et al. | |
| 5,367,200 A | 11/1994 | Leonida | |
| 5,604,751 A * | 2/1997 | Panis | 714/724 |
| 5,933,399 A | 8/1999 | Kim | |
| 6,084,452 A | 7/2000 | Drost et al. | |
| 6,150,847 A | 11/2000 | Lu | |
| 6,441,600 B1 * | 8/2002 | Atallah et al. | 324/76.11 |
| 6,593,789 B2 * | 7/2003 | Atallah et al. | 327/175 |

(Continued)

FOREIGN PATENT DOCUMENTS

EP 0957605 A2 11/1999

(Continued)

OTHER PUBLICATIONS

MAXIM—"Charge Pumps Shine in Portable Designs"; Maxim Application Note 669 (Mar. 15, 2001).

(Continued)

*Primary Examiner*—N. Drew Richards
*Assistant Examiner*—An T. Luu
(74) *Attorney, Agent, or Firm*—Matthew B Talpis; Mark P Kahler

(57) ABSTRACT

The disclosed methodology and apparatus measures the duty cycle of a reference clock signal that a clock circuit supplies to a duty cycle measurement (DCM) circuit located "on-chip", namely on an integrated circuit (IC) in which the DCM circuit is incorporated. In one embodiment, the DCM circuit includes a capacitor driven by a charge pump. The reference clock signal drives the charge pump. The clock circuit varies the duty cycle of the reference clock signal among a number of known duty cycle values. The DCM circuit stores resultant capacitor voltage values corresponding to each of the known duty cycle values in a data store. The DCM circuit applies a test clock signal having an unknown duty cycle to the capacitor via the charge pump, thus charging the capacitor to a new voltage value that corresponds to the duty cycle of the test clock signal. Control software accesses the data store to determine the duty cycle to which the test clock signal corresponds.

13 Claims, 10 Drawing Sheets

U.S. PATENT DOCUMENTS

| | | | |
|---|---|---|---|
| 6,664,834 B2 | 12/2003 | Nair et al. | |
| 6,700,530 B1 | 3/2004 | Nilsson | |
| 6,798,266 B1 | 9/2004 | Chang et al. | |
| 6,847,244 B2 | 1/2005 | Pillay et al. | |
| 7,002,358 B2 | 2/2006 | Wyatt | |
| 7,019,574 B2 * | 3/2006 | Schrödinger | 327/175 |
| 7,216,271 B2 * | 5/2007 | Tanaka et al. | 714/719 |
| 7,227,809 B2 | 6/2007 | Kwak | |
| 7,260,491 B2 * | 8/2007 | Boerstler et al. | 702/79 |
| 2002/0097035 A1 | 7/2002 | Atallah et al. | |
| 2005/0225314 A1 | 10/2005 | Belleau | |

OTHER PUBLICATIONS

Tsang, et al.—"Picosecond Imaging Analysis (PICA)"—IBM JRD, vol. 44, No. 4 (Jul. 2000).

Bhatti, et al.—"Duty Cycle Measurement & Correction Using a Random Sampling Technique"; Proceedings of the 48th IEEE Int'l. Midwest Symposium on Circuits & Systems, (Aug. 2005).

IBM—Cell Broadband Engine Architecture, ver. 1.0 (Aug. 2005).

Mantano—"A 1-Gb/s/pin 512-Mb DDRII SDRAM Using a Digital DLL and a Slew-Rate-Controlled Output Buffer"—downloaded from www.elpida.com on Mar. 13, 2006.

NAM—"An All-Digital CMOS Duty Cycle Correction Circuit with a Duty-Cycle Correction Range of 15-to- 85% for Multi-Phase Applications"; IEICE Trans. Electron., vol. E88-C, No. 4 (Apr. 2005).

Page—"IBMs Cell Processor: Preview to Greatness?"(May 15, 2005).

Travis, et al.—"Circuit Conditions Variable-Duty-Cycle Clock"; EDN Access (Feb. 17, 1997).

* cited by examiner

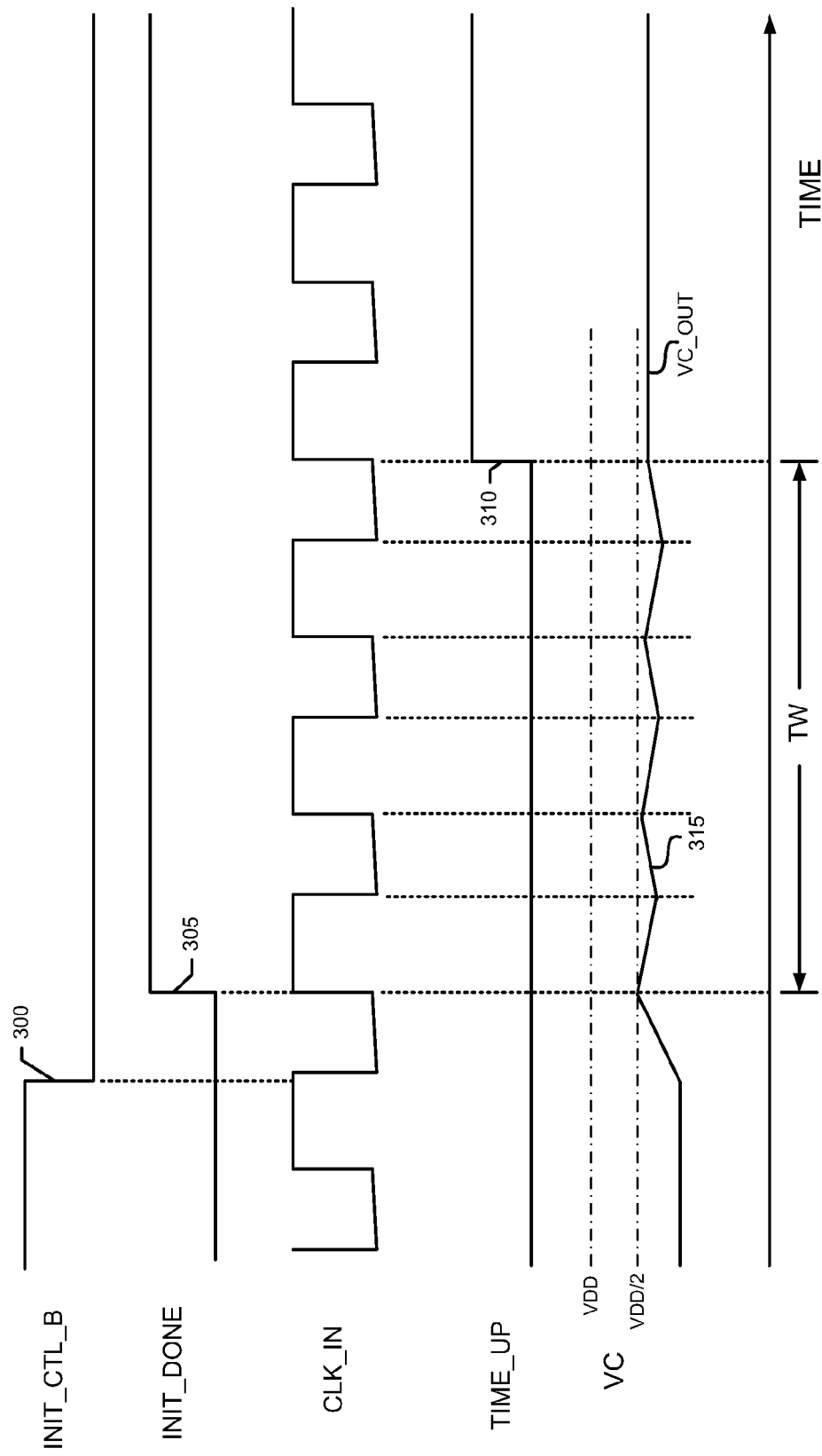

TIMING DIAGRAM
(CLK_IN = 50% DUTY CYCLE)

TIMING DIAGRAM
(CLK_IN <50% DUTY CYCLE)

METHOD AND APPARATUS FOR ON-CHIP DUTY CYCLE MEASUREMENT

CROSS REFERENCE TO RELATED PATENT APPLICATIONS

This patent application relates to the U.S. patent application entitled "Duty Cycle Measurement Method And Apparatus That Operates In A Calibration Mode And A Test Mode", inventors Boerstler, et al., Ser. No. 11/381,031, filed May 1, 2006 and assigned to the same assignee, the disclosure of which is incorporated herein by reference in its entirety.

This patent application also relates to the U.S. patent application entitled "Method and Apparatus For Correcting The Duty Cycle Of A Digital Signal", inventors Boerstler, et al., Ser. No. 11/381,050, filed May 1, 2006 and assigned to the same assignee, the disclosure of which is incorporated herein by reference in its entirety.

TECHNICAL FIELD OF THE INVENTION

The disclosures herein relate generally to digital systems, and more particularly, to a method and apparatus that measures the duty cycle of signals employed by such systems.

BACKGROUND

Duty cycle refers to the percentage of time that a digital signal, such as a clock signal, exhibits a high state during a full signal cycle or period. In older digital systems that employ relatively low clock speeds, the duty cycle of a reference clock signal is generally not critical to the performance of the system. However, as clock speed increases, the duty cycle of the clock signal may become very important to digital system performance.

When a high speed clock signal clocks a high performance processor, the duty cycle of that clock signal plays an important role in processor performance. For example, the processor may access system memory on both the leading and trailing edges of clock signal pulses. In that case, memory access speed exhibits a direct relationship to the duration of the clock signal pulses. Thus, the duty cycle of the clock pulses directly affects memory access speed.

Processor system designers typically prefer a 50% duty cycle for the reference clock signal that clocks a processor and memory system. However, the optimum duty cycle of the clock signal for maximum system performance varies with particular semiconductor components. Causes for this variation in the optimum duty cycle include semiconductor process variation and variation in the correlation between semiconductor models and the resultant manufactured semiconductor hardware.

To optimize the duty cycle of a clock signal in a particular application, it is important to first be able to measure the duty cycle of that signal. Unfortunately, measuring the duty cycle of a high speed clock signal in a processor or other digital integrated circuit (IC) presents many problems. For example, if an external duty cycle measurement circuit couples to a clock pin of the IC, the logic in the measurement circuit causes duty cycle degradation of the original clock signal. In other words, the external logic of the measurement circuit alters the duty cycle of the original clock signal thus making the measurement of the duty cycle inherently inaccurate.

Another approach to measuring the clock signal of a digital IC is picosecond imaging circuit analysis (PICA) that detects photons of light emitted on the leading and trailing edges of clock pulses to determine their duty cycle. While this type of duty cycle analysis does work, it is very expensive. Moreover, this type of analysis destroys the component under test.

What is needed is a duty cycle measurement method and apparatus that address the problems discussed above.

SUMMARY

Accordingly, in one embodiment, a method is disclosed for determining the duty cycle of a digital signal. The method includes supplying a first digital signal to a duty cycle measurement (DCM) circuit situated on an integrated circuit (IC) that includes a capacitor. The method also includes charging, by charger circuitry in the DCM circuit, the capacitor to a voltage value that depends on the duty cycle of the first digital signal. The method further includes varying the duty cycle of the first digital signal to a plurality of different known duty cycle values, the first digital signal charging the capacitor to a different voltage value for each of the known duty cycle values thereof. The method still further includes storing, in a data store, each voltage value and the corresponding known duty cycle value. In one embodiment, the method also includes supplying a second digital signal to the DCM circuit, the second digital signal exhibiting an unknown duty cycle. The method also includes charging, by the charger circuitry, the capacitor with the second digital signal to a voltage value corresponding to the unknown duty cycle of the second digital signal. The method further includes accessing the data store to determine to which duty cycle the voltage value of the second digital signal corresponds.

In another embodiment, a duty cycle measurement (DCM) system is disclosed that determines the duty cycle of a digital signal. The system includes a DCM circuit situated on an integrated circuit (IC). The DCM circuit includes an input that receives a digital signal exhibiting a duty cycle. The DCM circuit also includes a capacitor and charger circuitry, the charger circuitry being coupled to the input and the capacitor. The charger circuitry charges the capacitor to a voltage that depends on the duty cycle of the digital signal. The DCM circuit also includes an output, coupled to the capacitor, that provides a voltage value corresponding to the duty cycle of the digital signal. The system further includes a reference clock circuit, coupled to the input, that supplies a reference clock signal to the input as the digital signal. The reference clock circuit varies the duty cycle of the reference clock signal to a plurality of different known duty cycle values, the reference clock signal charging the capacitor to a respective voltage value for each of the known duty cycle values thereof. The system also includes a data store, coupled to the output, that stores the respective voltage values and corresponding known duty cycle values.

BRIEF DESCRIPTION OF THE DRAWINGS

The appended drawings illustrate only exemplary embodiments of the invention and therefore do not limit its scope because the inventive concepts lend themselves to other equally effective embodiments.

FIG. 3A shows a timing diagram that depicts signals in the IHS of FIG. 2 wherein the duty cycle of the reference clock signal is greater than 50%.

DETAILED DESCRIPTION

Figure 1:
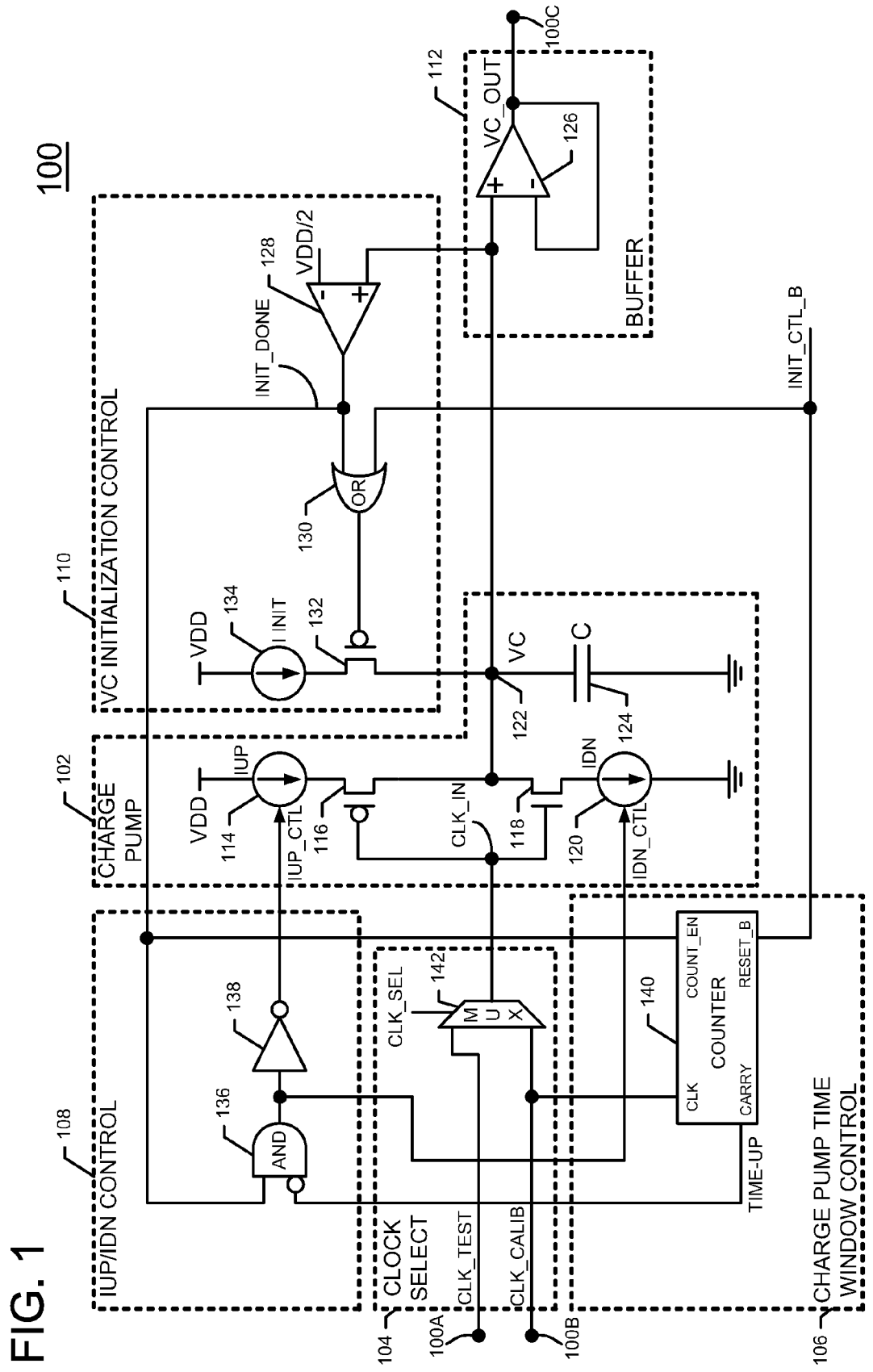
FIG. 1 shows one embodiment of the disclosed duty cycle measurement (DCM) apparatus.

FIG. 1 depicts a duty cycle measurement (DCM) circuit 100 that measures the duty cycle of a digital signal, for example a binary clock signal CLK_TEST, present at test input 100A. DCM circuit 100 also includes a calibration input 100B that receives a calibration clock signal CLK_CALIB exhibiting a known duty cycle. DCM circuit 100 further includes an output 100C that provides an output voltage VC_OUT that includes duty cycle information. The value of VC_OUT varies with the duty cycle of the clock signal CLK_TEST at test input 100A. In other words, as the duty cycle of the clock signal CLK_TEST at input 100A varies, the value of the output voltage VC_OUT at output 100C correspondingly varies. In one embodiment, the output voltage VC_OUT varies inversely or indirectly with the duty cycle of the input CLK_TEST signal. In other words, as the clock duty cycle of the input CLK_TEST signal increases, the corresponding VC_OUT decreases. Other embodiments are possible that employ direct variation wherein, for example, as the clock duty cycle increases the corresponding VC_OUT also increases. In one embodiment, the relationship between VC_OUT and the duty cycle of the clock signal is linear.

Figure 2:
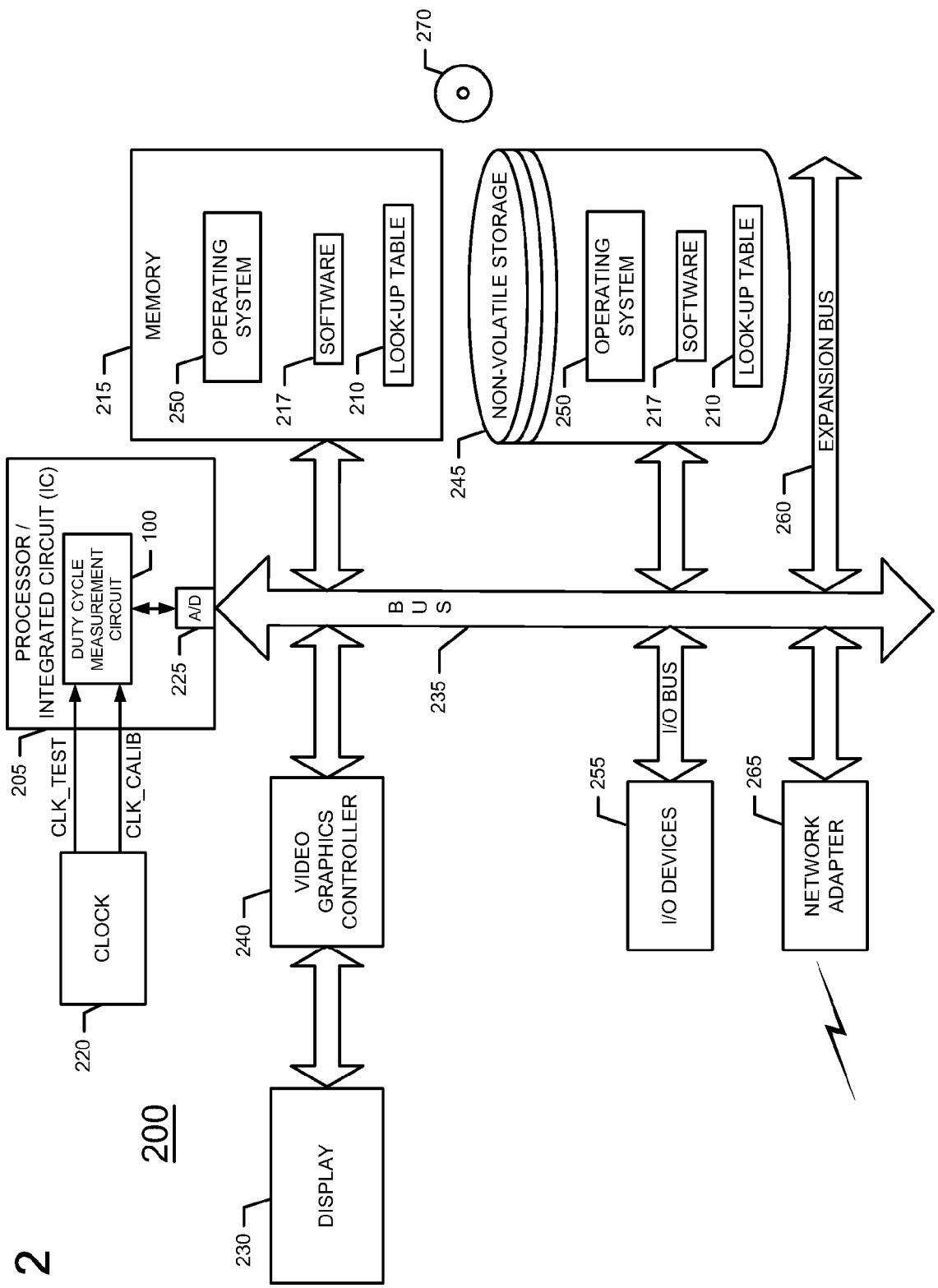
FIG. 2 shows an information handling system (IHS) embodiment that employs the disclosed DCM apparatus of FIG. 1.

In one embodiment shown in FIG. 2, an integrated circuit (IC) 205 includes duty cycle measurement circuit 100 on a substrate or chip along with other functional blocks. In other words, this arrangement is an "on-chip" configuration wherein IC 205 includes DCM circuit 100 and other functional blocks on a common chip or substrate. By providing the DCM circuit 100 "on-chip", this arrangement ameliorates the duty cycle degradation problems experienced by external or "off-chip" DCM techniques. Integrated circuit 205 may exhibit several different configurations such as a processor, microprocessor, microcontroller and virtually any digital logic circuit for which duty cycle measurement is desirable. In the particular embodiment shown in FIG. 2, IC 205 is a processor that functions in an information handling system (IHS) 200. Information handling system (IHS) 200 is discussed in more detail below.

Returning to FIG. 1, DCM circuit 100 includes a charge pump circuit 102, a clock select circuit 104, a charge pump time window control circuit 106, an IUP/IUD control circuit 108, a VC initialization control circuit 110 and an output buffer 112, all coupled together as shown. DCM circuit 100 operates initially in a calibration mode, and then in a test mode after completion of calibration, as explained in more detail below. Charge pump circuit 102 includes the following series-coupled elements coupled between a voltage source VDD and ground: an IUP current source 114, a PFET 116, an NFET 118, and an IDN current source 120. The drain of PFET 116 couples to the drain of NFET 118 to form a node 122. A capacitor 124 couples node 122 to ground. IUP current source 114 and IDN current source 120 control the amount of charge in capacitor 124 and thus the voltage VC exhibited by node 122.

The following presents a high level view of the operation of the calibration mode and test mode in DCM circuit 100 followed by a more detailed discussion. In one embodiment, during the calibration mode, DCM circuit 100 sets the voltage VC at node 122 to a predetermined voltage equal to VDD/2, namely one half the rail voltage VDD. DCM circuit 100 calibrates IUP current source 114 and IDN current source to operate in a balanced fashion such that IUP current source 114 sources as much current to capacitor 124 as IDN current source 120 sinks or drains from capacitor 124. The voltage VC across capacitor 124 thus stabilizes at a predetermined voltage, VDD/2.

While in calibration mode, DCM circuit 100 applies an external clock signal, CLK_CALIB, exhibiting a known duty cycle, for example 60%, to charge pump circuit 102. In a 60% duty cycle clock signal, the clock pulse is high for 60% of the clock period while the clock pulse is low for the remaining 40% of the clock period. Providing a 60% duty cycle signal to the charge pump circuit 102 in this manner disturbs the previously existing balance between the current sourcing action of IUP current source 114 and the current sinking action of IDN current source 120. In other words, providing a 60% duty cycle signal to the charge pump circuit 102 drives the voltage VC lower than the predetermined stabilized VDD/2 in this particular embodiment. Similarly, providing a lower duty cycle signal such as a 40% duty cycle signal to charge pump circuit 102 drives the voltage VC higher than the predetermined stabilized VDD/2 value.

Information handling system (IHS) 200 of FIG. 2, acting as a test apparatus in one embodiment, provides a plurality of clock signals CLK_CALIB with different known duty cycles to IC 205 and the DCM circuit 100 therein. Each different duty cycle clock signal causes a different respective voltage VC at node 122. IHS 200 records the duty cycle, frequency and corresponding voltage VC for each of the different clock calibration signals in a look-up table 210 situated in a memory or data store 215. Calibration mode completes when look-up table 210 fills with duty cycle data. IHS 200 then switches to a test mode wherein IHS 200 supplies a test signal CLK_TEST to DCM circuit 100. IHS 200 takes a reading of the resultant VC value at node 122 by reading the VC_OUT voltage at output 100C. IHS 100 then accesses look-up table 210 to determine which duty cycle value most closely matches the present VC_OUT voltage value. If the VC_OUT voltage value falls between two VC_OUT voltage data points in lookup table 210, then IHS 200 extrapolates or interpolates from these two data points to determine the actual duty cycle corresponding to that VC_OUT voltage value. A more detailed discussion of the calibration and test modes of DCM 100 follows below.

Upon entering calibration mode, VC initialization control circuit 110 initializes the voltage VC at node 122 to a predetermined voltage, namely VDD/2, in this particular embodiment. VC initialization control circuit 110 couples to output buffer 112. Output buffer 112 effectively transfers the VC voltage at capacitor 124 to output 100C as the output voltage, VC_OUT. In one embodiment, buffer 112 includes a differential amplifier 126 configured as shown in FIG. 1. In this manner, variations in VC_OUT correspond to variations in the capacitor voltage VC.

In more detail, VC initialization control circuit 110 includes a comparator 128, the non-inverting input of which couples to the non-inverting input of differential amplifier 126 in buffer 112. The inverting input of comparator 128 couples to a voltage source (not shown) that provides a voltage that equals ½ the supply or rail voltage, namely VDD/2. The output of comparator 128 couples to one input of OR gate 130, the output of which couples to a PFET 132. PFET 132 controls whether or not current flows from current source 134 to charge capacitor 124 at node 122. The remaining input of OR gate 130 receives an initialization control bar signal, INIT_CTL_B, that initially exhibits a logic low or zero at the commencement of the calibration mode. The series-coupled combination of PFET 132 and current source 134 couples between voltage rail VDD and capacitor 124 as shown. In this manner, the signal at the output of OR gate 130 controls whether PFET 132 turns on to allow a current, I INIT, to flow from current source 134 into capacitor 124 at node 122, or turns off to prevent such current flow.

The calibration process starts with DCM circuit 100 first receiving a supply rail voltage, namely VDD. The INIT_CTL_B signal controls the beginning of the initialization process after DCM circuit 100 receives power. The INIT_CTL_B signal transitions from high to low to start initialization of DCM circuit 100. Comparator 128 generates an initialization done signal INIT_DONE that is initially low to indicate that initialization is not yet complete. When the INIT_DONE signal later goes high, this indicates that initialization of the voltage VC at a predetermined value, VDD/2, is complete.

Initially the voltage VC at node 122 is zero. Comparator 128 determines that the zero voltage at its non-inverting input is less than the VDD/2 voltage at its inverting input. Thus, comparator 128 outputs a logical zero that one input of OR gate 130 receives. In response, OR gate 130 generates a logic low output because the other OR gate input is already low due to the low state of the INIT_CTL_B signal. In response to the output of OR gate 130 going low, PFET 132 turns on, thus connecting current source 134 to capacitor 124. The current I INIT from current source 134 charges capacitor 124 up to the voltage VDD/2Comparator 128 then detects that the VC voltage now equals VDD/2 and thus the output of comparator 128 goes low. The initialization done signal, INIT_DONE, now transitions high to indicate that initialization is complete, thus leaving the VC voltage on capacitor 124 initialized at VDD/2, which is ½ the supply rail voltage VDD.

To allow VC initialization control circuit 110 to initialize the VC voltage on capacitor 124 at VDD/2, DCM circuit 100 effectively turns off charge pump circuit 102 while circuit 110 conducts this initialization. To achieve this result, the output of comparator 128 of VC initialization circuit 110 couples to one input of AND gate 136 in IUP/IDN control circuit 108. IUP/IDN control circuit 108 may enable IUP current source 114 to source charge into node 122 to charge capacitor 124 up. IUP/IDN control circuit 108 may also enable IDN current source 120 to discharge capacitor 124 down. IUP/IDN control circuit 108 may also disable both IUP current source 114 and IDN current source 120 such as during the above-described initialization process.

During calibration mode, IUP/IDN control circuit 108 initially turns charge pump circuit 102 off to allow VC initialization control circuit 110 to charge up the voltage VC at node 122 to VDD/2In this particular embodiment, IUP current source 114 is an active low device. Thus, IUP current source 114 turns off when the IUP_CTL control signal on its enable input is high, and turns on when the IUP_CTL control signal is low. In contrast, IDN current source 120 is an active high device in this embodiment. Thus, IDN current source 120 turns off when the IDN_CTL control signal on its enable input is low, and turns on when the IDN_CTL control signal is high. Those skilled in the art may invert the logic described above and still achieve the same result. As discussed above, during calibration mode, comparator 128 initially exhibits a logic low or zero output. One input of AND gate 136 receives this logic zero and AND gate 136 exhibits a logic low or one in response. Inverter 138 inverts this logic low to a logic high that inverter 138 presents to the enable input of current source 114 as the IUP_CTL signal. In response to the logic high IUP_CTL enable signal, charge pump 114 turns off.

The output of AND gate 136 also couples to the enable input of IDN current source 120. Thus the logic low or zero at the output of AND gate 136 flows to the enable input of IDN current source 120 as the IDN_CTL enable signal. In this embodiment, because current source 120 is an active high device, this logic low turns IDN current source 120 off. Thus, during calibration mode, the IUP and IDN current sources of charge pump 102 are initially off. This allows VC initialization control circuit 110 to initialize node 122 at a voltage VDD/2 without disturbance from charge pump circuit 102 at the beginning of calibration mode.

Once initialization is complete and the voltage VC at capacitor 124 reaches VDD/2, then the output of comparator 128 switches to a logic high. In other words, the INIT_DONE signal at the output of comparator 128 changes from a logic low to a logic high. Comparator 128 sends this logic high or 1 to both IUP/IDN control circuit 108 and to counter 140 in charge pump time window control circuit 106. While in calibrate mode, DCM circuit 100 activates the CLK_SEL signal to instruct multiplexer (MUX) 142 to select the CLK_CALIB clock calibration signal and pass that signal through to the multiplexer's output. The CLK_CALIB clock calibration signal is a reference clock signal exhibiting a known duty cycle, for example 50%. The CLK_CALIB input of MUX 142 couples to the clock input CLK of counter 140. In this manner, MUX 142 and counter 140 both receive the CLK_CALIB signal. The logic high on the COUNT_EN input of counter 140 activates counter 140 of charge pump time window control circuit 106. Thus, counter 140 now starts counting the calibration clock pulses that it receives on its CLK input. However, before such counting starts, DCM circuit 100 sends the initial control bar signal, INIT_CTL_B, exhibiting a logic low to the RESET_B input of counter 140. This resets the count within counter 140 to zero before counting commences. Counter 140 then starts counting up from zero until it reaches a predetermined number of clock pulses, at which time counter 140 toggles its CARRY bit from zero to 1 to signal completion of a timing window. An INIT_CTL_B signal generator (not shown) generates the INIT_CTL_B signal.

During the timing window controlled by counter 140, both IUP current source 114 and IDN current source 120 turn on. Thus, IUP current source 114 sources current into node 122 and capacitor 124. Moreover, IDN current source 120 sinks or draws current from node 122 and capacitor 124 during the timing window. In more detail, during the timing window (TW), while counter 140 counts up from zero, the CARRY output of counter 140 exhibits a logic low or zero. The CARRY output generates a TIME-UP signal that indicates the end of timing window. This logic zero in the TIME-UP signal inverts to a logic high or one at the inverting input of AND gate 136. The remaining input of AND gate 136 is also a logic high or one because the output of comparator 128 switches to a logic high once the voltage VC at node 122 reaches the VDD/2 initial value. Thus, since both AND gate inputs exhibit a logic high, the output of AND gate 136 also exhibits a logic high. Inverter 138 inverts this logic high to a logic low before supplying this signal to IUP current source 114 as the enable signal, IUP_CTL. IUP current source 114 is an active low device and thus the logic low IUP_CTL signal on the enable input of IUP current source 114 causes IUP current source 114 to turn on.

As seen in FIG. 1, the output of AND gate 136 also couples to the enable input of IDN current source 120. Thus, AND gate 136 provides the logic high signal at its output as the enable signal IDN_CTL to the enable input of IDN current source 120. IDN current source 120 is an active high device and thus the logic high signal at its enable input causes IDN current source 120 to turn on. Thus, during the timing window TW, both IUP current source 114 and IDN current source 120 turn on to respectively charge up and discharge capacitor 122.

While both IUP current source 114 and IDN current source 120 exhibit an enabled state or turned-on state during the timing window, current does not flow from these enabled current sources unless PFET 116 or NFET 118 turn on to permit such current flow. However in actual practice, the CLK_IN clock signal at the output of MUX 142 instructs PFET 116 and NFET 118 to alternatingly to turn on during the timing window. Thus, the IUP and IDN current sources of charge pump circuit 102 do activate during the timing window to provide an activated charge pump during the timing window. When IUP current source 114 is on, IDN current source 120 is off, and vice versa. When the INIT_DONE signal at the output of comparator 128 transitions from low to high, this causes the COUNT_EN count enable input of counter 140 to go high. With the counter 140 now enabled, counter 140 starts the time window TW and begins counting clock pulses at its CLK input. In other words, counter 140 counts the pulses of the CLK_CALIB clock calibration signal of known duty cycle during the time window. The time window ends after counter 140 counts up to the predetermined number of pulses. Upon reaching the end of the time window, counter 140 send a logic 1 to its CARRY output thus providing a logic 1 value to the TIME-UP signal that the inverting input of AND gate 136 receives. This action transitions the output of AND gate 136 to a logic low, thus disabling IUP current source 114 and IDN current source 120.

Each clock pulse includes a logic high portion and a logic low portion. Depending on the duty cycle of a particular clock pulse, the logic high may be equal in time duration to the logic low to provide a 50% duty cycle. If the logic high of a clock signal pulse is longer in time duration than the logic low, then this clock signal exhibits a duty cycle greater than 50%. If the logic low of a clock signal is longer in time duration than the logic high, then this clock signal exhibits a duty cycle less than 50%. The following describes how charge pump circuit 102 behaves for cases wherein the clock signal at the output of MUX 142 exhibits a 50% duty cycle, a duty cycle greater than 50% and a duty cycle less then 50%.

PFET 116 is an active low device because it turns on when it receives a logic low signal on its input or gate. NFET 118 is an active high device because it turns on when it receives a logic high on its input or gate. Thus, when PFET 116 receives a logic low signal, such as during the low portion of a clock pulse, then PFET 116 turns on to allow IUP current source 114 to charge capacitor 124 during the low portion of the clock pulse. While PFET 116 is on for the low portion of a clock pulse, NFET 118 is off. When NFET 118 receives a logic high signal, such as during the high portion of a clock pulse, then NFET 118 turns on to allow IDN current source 120 to drain charge from capacitor 124. Stated alternatively, during the low portions of clock signal pulses, IUP current source 114 sinks current into and charges capacitor 124. However, during the high portions of clock signal pulses, IDN source 120 sinks current from capacitor 124 and discharges capacitor 124.

The clock signal, CLK_IN, that MUX 142 provides to charge pump circuit 102 includes a series of pulses during the time window TW. Each pulse in this series of clock pulses includes a logic low portion and a logic high portion. If the logic low portion and logic high portion exhibit the same time duration, as in the case of a 50% duty cycle clock signal, then over time IUP current source 114 will charge up capacitor 124 as much as IDN current source 120 drains down capacitor 124. In this case, the voltage VC across capacitor 124 will remain at its initialized value, namely VDD/2 Thus, for the 50% duty cycle scenario, the voltage of VC at the end of the time window TW is the same as the voltage VC at the beginning of the time window TW.

However, if the logic high portion of each pulse exhibits a greater time duration than the logic low portion, as in the case of a clock signal with a greater than 50% duty cycle, then over time IDN current source 120 will drain charge from capacitor 124 more than IUP current source 114 supplies or sources charge into capacitor 124. In this case, the voltage VC across capacitor 124 will decrease during time window TW from the initialized value, namely VDD/2, to a smaller end voltage VC at the end of the time window TW.

In another scenario, if the logic low portion of each pulse exhibits a greater time duration than the logic high portion, as in the case of a clock signal with a less than 50% duty cycle, then over time IUP current source 114 will source charge to capacitor 124 more than IDN current source 120 drains or sinks charge from capacitor 124. In this case, the voltage VC across capacitor 124 will increase during time window TW from the initialized value, namely VDD2, to a larger end voltage VC at the end of the time window TW.

While in calibration mode, IHS 200 collects calibration information or data relating to a number of different data points. More specifically, IHS 200 collects calibration information such as the duty cycle and frequency of the CLK_CALIB signal and the corresponding resultant voltage VC. To accomplish this data collection, a control application or control software 217 in IHS 200 instructs clock circuit 220 to vary the duty cycle and frequency of the CLK_CALIB clock calibration signal that clock circuit 220 provides to DCM circuit 100. In this capacity, control software 217 acts as a control mechanism. For each duty cycle and frequency value of the CLK_CALIB signal, IHS 200 determines and stores the corresponding VC_OUT voltage value. VC_OUT is the same voltage value as voltage VC at node 122 after buffering by isolation buffer circuit 112. In one embodiment, control software 217 acts as a control mechanism in IHS 200 to store the clock frequency, clock duty cycle and corresponding VC_OUT voltage value in look-up table 210 as seen in FIG. 2. Table 1 below shows a representative look-up table (LUT) 210 for storing operating condition information such as duty cycle measurement (DCM) information.

TABLE 1

| Look-Up Table (LUT) | | |
| --- | --- | --- |
| Frequency (F) | Duty Cycle (%) | VC_OUT |
| 1 GHZ | 30% | VDD/2 + Delta2 (=0.85 v) |
| 1 GHZ | 40% | VDD/2 + Delta1 (=0.79 v) |
| 1 GHZ | 50% | VDD/2 (=0.73 v) |
| 1 GHZ | 60% | VDD/2 − Delta1 (=0.67 v) |
| 1 GHZ | 70% | VDD/2 − Delta2 (=0.61 v) |
| 2 GHZ | 30% | VDD/2 + Delta2 |

TABLE 1-continued

Look-Up Table (LUT)

| Frequency (F) | Duty Cycle (%) | VC_OUT |
|---|---|---|
| 2 GHZ | 40% | VDD/2 + Delta1 |
| 2 GHZ | 50% | VDD/2 |
| 2 GHZ | 60% | VDD/2 − Delta1 |
| 2 GHZ | 70% | VDD/2 − Delta2 |
| 3 GHZ | 30% | VDD/2 + Delta2 |
| 3 GHZ | 40% | VDD/2 + Delta1 |
| 3 GHZ | 50% | VDD/2 |
| 3 GHZ | 60% | VDD/2 − Delta1 |
| 3 GHZ | 70% | VDD/2 − Delta2 |

Referring to Table 1, IHS 200 first provides a CLK_CALIB clock signal exhibiting a 1 GHZ frequency and a 30% duty cycle to input 100B of DCM circuit 100. IHS 200 then senses the resultant VC_OUT value at output 100C, namely the initial VDD/2 voltage value plus some delta value, Delta2. For a representative DCM circuit 100 wherein IUP and IDN=150 µA, capacitor 124=24 pF, and the time window (TW) equals 50 nS, IHS 100 senses a VC_OUT of 0.85v at output 100C. To sense or observe the VC_OUT voltage, in one embodiment, processor 205 includes an analog to digital (A/D) converter 225 that converts the analog voltage VC_OUT to a digital equivalent voltage value. Thus, in the current example, IHS 200 stores the following values or the digital equivalents thereof in the first row of look-up table 210 (Table 1 above) namely: 1 GHz, 50% duty cycle, and 0.85v. After storing these data points in the look-up table, IHS 200 then sends a CLK_CALIB signal exhibiting a 1 GHz clock frequency and a 40% duty cycle to DCM circuit 200. IHS 200 observes the resultant VC_OUT voltage and stores that voltage value along with the frequency and duty cycle information in the second row of look-up table 210 (Table 1 above). IHS 200 continues varying the duty cycle of the CLK_CALIB signal to obtain the corresponding VC_OUT voltage values and stores these values in look-up table 210 until the table is complete.

In one embodiment, IHS 200 may change the frequency of the CLK_CALIB signal to other frequencies such as 2 GHz and 3 GHz and collect the corresponding VC_OUT voltage values for storage in look-up table 210 (Table 1) as shown above. CLK_CALIB signals exhibiting the same duty cycle regardless of frequency should result in approximately the same VC_OUT voltage value. For example, for the same observation time window (TW), a 2 GHz or 3 GHz CLK_CALIB signal exhibiting a 30% duty cycle will cause the same amount of IUP current and IDN current thus resulting in the same VC_OUT. This holds true for other CLK_CALIB duty cycles as well.

Once IHS 200 stores the completed look-up table 210 in memory 215, DCM circuit 100 is ready to switch from calibration mode to test mode to measure the duty cycle of an incoming digital signal having an unknown duty cycle. As noted above, a clock circuit 220 provides the calibration clock signal CLK_CALIB to DCM circuit 100 during calibration mode. In test mode, clock circuit 220 may also provide a CLK TEST signal of unknown duty cycle to DCM circuit 100 under the direction of control software 217 which acts as a control mechanism. The CLK_TEST signal is a clock signal of unknown duty cycle that DCM circuit 100 analyzes to determine its duty cycle. In an alternative embodiment, a separate clock circuit other than clock circuit 220 may provide a CLK TEST signal of unknown duty cycle to DCM circuit 100. In either case, DCM circuit 100 determines the duty cycle of the CLK_TEST signal by applying that signal as the CLK_IN signal to charge pump 102 in the same manner as the earlier application of the CLK_CALIB signal thereto in calibration mode. However, when clock circuit 220 applies the CLK_TEST signal to DCM circuit 100, IHS 100 asserts the CLK_SEL signal so as to select the CLK_TEST signal at MUX 142 instead of the CLK_CALIB signal. MUX 142 now provides the CLK_TEST signal to charge pump 102 as the CLK_IN signal. IHS 200 measures the resultant VC_OUT signal at output 100C and reports this information to control software 217.

In one embodiment, control software 217 then accesses look-up table 210 and determines the data points representing the 2 closest VC_OUT values stored in that table. Program 217 interpolates between these two values to determine the actual duty cycle of the CLK_TEST signal corresponding to the measured VC_OUT value. The VC_OUT voltage varies linearly with the duty cycle of the CLK_IN signal. This linear relationship facilitates interpolation of the actual duty cycle value. In another embodiment, the control software may extrapolate the duty cycle of the current CLK_IN signal from other duty cycle and VC_OUT data points along the line formed by the data points in LUT 210. In one embodiment, control software program 217 sends the determined duty cycle value of the CLK_TEST test signal to display 230 for viewing by a test operator or other user.

As seen in FIG. 2, IHS 200 includes a bus 235 that couples processor 205 to memory 215 and a video graphics controller 240. Display 230 couples to video graphics controller 240. Nonvolatile storage 245, such as a hard disk drive, CD drive, DVD drive, or other nonvolatile storage couples to bus 235 to provide IHS 200 with permanent storage of information. Nonvolatile storage 245 thus acts as a permanent data store. An operating system 250 loads from non-volatile storage 245 into memory 215 to govern the operation of IHS 200. Control software 217 and look-up table 210 also load from nonvolatile storage into memory 215. I/O devices 255, such as a keyboard and a mouse pointing device, couple to bus 235. One or more expansion busses 260, such as USB, IEEE 1394 bus, ATA, SATA, PCI, PCIE and other busses, couple to bus 235 to facilitate the connection of peripherals and devices to IHS 200. A network adapter 265 couples to bus 235 to enable IHS 200 to connect by wire or wirelessly to a network and other information handling systems. While FIG. 2 shows one IHS that employs processor 205, the IHS may take many forms. For example, IHS 200 may take the form of a desktop, server, portable, laptop, notebook, or other form factor computer or data processing system. IHS 200 may take other form factors such as a gaming device, a personal digital assistant (PDA), a portable telephone device, a communication device or other devices that include a processor and memory.

FIG. 3A is a timing diagram that shows timing, control and data signals employed by DCM circuit 200 when operating on a clock signal CLK_IN exhibiting a duty cycle greater than 50%. More specifically, FIG. 3A is an amplitude vs. time graph that shows the INIT_CTL_B signal, the INIT_DONE signal, the CLK_IN signal, the TIME_UP signal and the VC voltage at node 122. The INIT_CTL_B signal transitions from high to low at transition 300 to instruct VC initialization control circuit 110 to initialize the node voltage VC at an initial value of VDD/2 Transition 300 of the INIT_CTL_B signal also instructs counter 140 to reset its count to zero so that counter 140 is ready to count once the time window (TW) begins. When initialization completes, namely when node 122 reaches the initial voltage VDD/2, the INIT_DONE signal then transitions from low to high at transition 305 to begin the time window (TW).

CLK_IN represents either the CLK_CALIB clock signal of calibration mode or the CLK_TEST clock signal of test mode, depending on which of these modes that the CLK_SEL signal selects at MUX 142. In the subject example that involves the calibration mode, the CLK_SEL signal selects the CLK_CALIB signal as the CLK_IN signal. Immediately after the initialization of node 122 at the voltage VDD/2, the INIT_DONE signal transitions to a logic high at transition 305 to begin time window TW. During window TW, counter 140 counts CLK_IN pulses up to a predetermined number of pulses that defines the duration of window TW. Counter 140 stops counting when it reaches the predetermined number of CLK_IN pulses. In response, the CARRY output of counter 140 goes high thus transitioning the TIME_UP signal from low to high at transition 310 to end time window TW. In this scenario wherein the duty cycle of the clock signal CLK_IN is greater than 50%, over each clock pulse period the amount of time that the IDN current source 120 sinks current from capacitor 124 exceeds the amount of time that the IUP current source 114 pumps or sources current into comparator 124. Thus, over the duration of time window TW the alternating sourcing of current into, and sinking current from, capacitor 124 generates a sawtooth-like curve 315 that decreases in amplitude over time until reaching the final VC_OUT value at the end of time window TW. The voltage VC decreases over time from the initial VDD/2 value because more sinking of current from, than sourcing current into, node 122 occurs throughout the duration of time window TW. In one embodiment, the duration of time window TW in test mode is the same as the duration of time window TW in calibration mode.

Figure 3B:
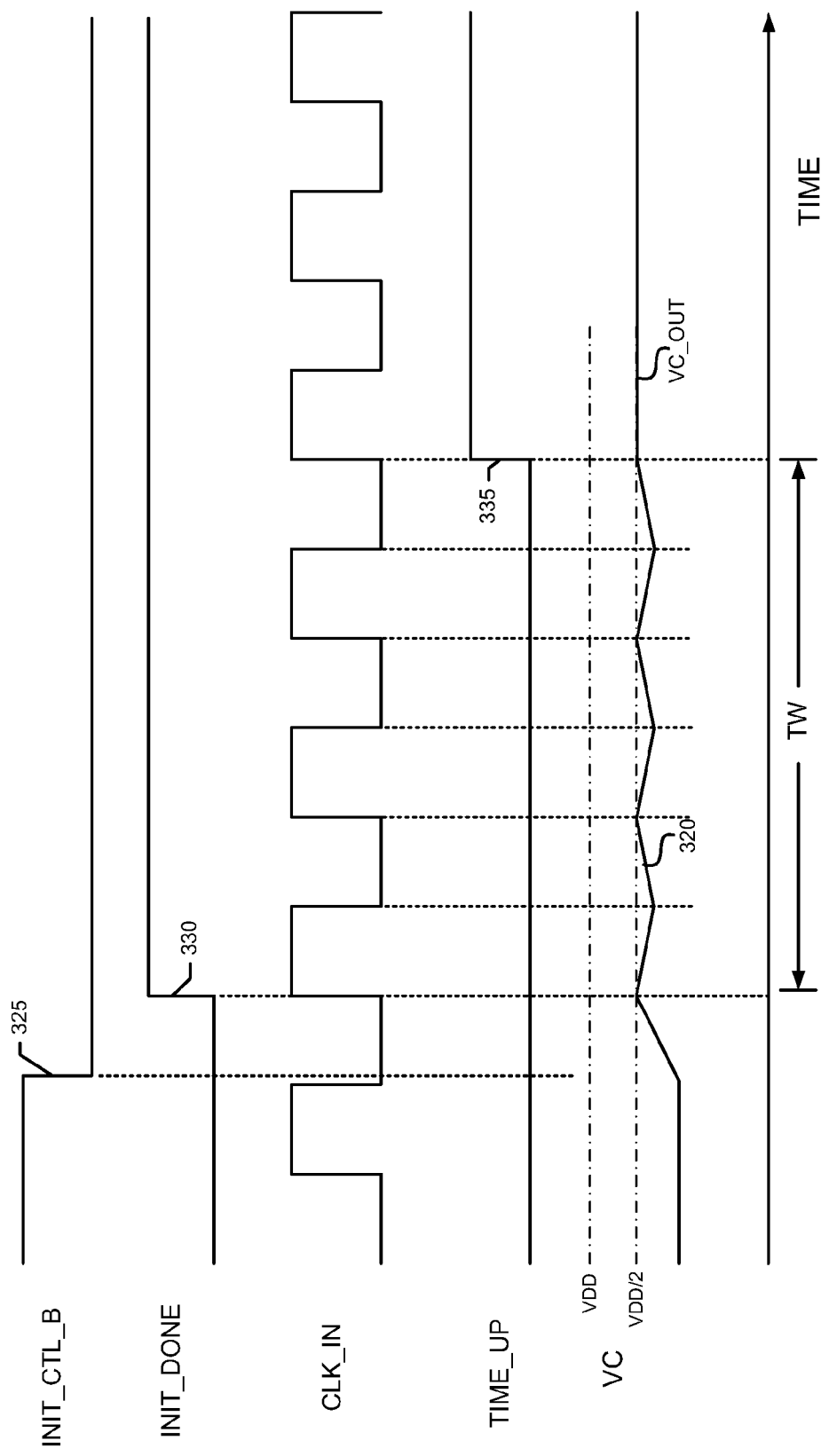
FIG. 3B shows a timing diagram that depicts signals in the IHS of FIG. 2 wherein the duty cycle of the reference clock signal equals 50%.

FIG. 3B is a timing diagram that shows timing, control and data signals employed by DCM circuit 200 when operating on a clock signal CLK_IN exhibiting a duty cycle equal to 50%. In this scenario wherein the duty cycle of the clock signal is equal to 50%, over each clock pulse period the amount of time that the IUP current source 114 sources current into capacitor 124 equals the amount of time that the IUP current source 120 sinks current from capacitor 124 to ground. Thus, over the duration of time window TW the sourcing of current into, and sinking current from, capacitor 124 generates a sawtooth-like curve 320 that ends with substantially the same voltage value, VDD/2, as when it begins. In FIG. 3B, the INIT_CTL_B signal transitions from high to low at transition 325 to begin calibration mode with the initialization of node 122 at the predetermined voltage, VDD/2 The INIT_DONE signal transitions from low to high at transition 330 to end the initialization of node 122 at voltage VDD/2 and to commence test mode by starting time window TW. As before, counter 140 counts the pulses of the CLK_IN signal during time window TW until reaching the end of time window TW. At the end of time window TW the CARRY output and TIME_UP signal transition from low to high at transition 335 thus signifying the end of the time window and the end of the count. In one embodiment, the duration of time window TW for the 50% duty cycle case is the same as the duration of time window TW for the >50% duty cycle case.

Figure 3C:
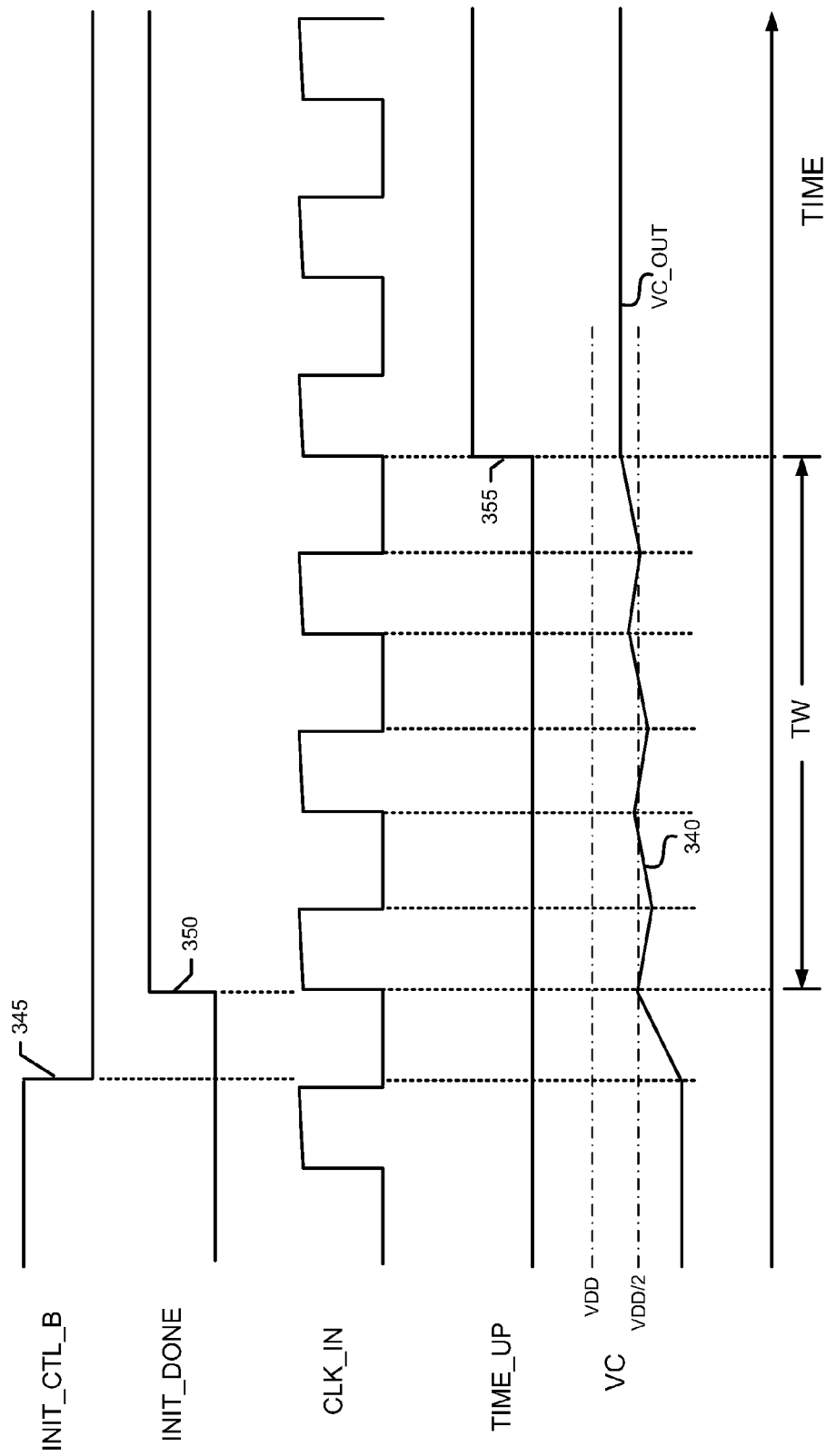
FIG. 3C shows a timing diagram that depicts signals in the IHS of FIG. 2 wherein the duty cycle of the reference clock signal is less than 50%.

FIG. 3C is a timing diagram that shows timing, control and data signals employed by DCM circuit 200 when operating on a clock signal CLK_IN exhibiting a duty cycle less than 50%. In this scenario wherein the duty cycle of the clock signal is less than 50%, over each clock pulse period the amount of time that the IUP current source 114 sources current into capacitor 124 exceeds the amount of time that the IUP current source 120 sinks current from capacitor 124 to ground. Thus, over the duration of time window TW the sourcing of current into, and sinking current from, capacitor 124 generates a sawtooth-like curve 340 that increases in amplitude over time until reaching the final VC_OUT value at the end of time window TW. In FIG. 3C, the INIT_CTL_B signal transitions from high to low at transition 345 to begin calibration mode with the initialization of node 122 at the predetermined voltage, VDD/2 The INIT_DONE signal transitions from low to high at transition 350 to end the initialization of node 122 at voltage VDD/2 and to commence test mode by starting time window TW. As before, counter 140 counts the pulses of the CLK_IN signal during time window TW until reaching the end of time window TW. At the end of time window TW the CARRY output and TIME_UP signal transition from low to high at transition 355 thus signifying the end of the time window and the end of the count. In one embodiment, the duration of time window TW for the <50% duty cycle case is the same as the duration of time window TW for the >50% duty cycle case and the =50% duty cycle case. Moreover, the duration of time window TW in calibration mode is the same as the duration of time window TW in test mode.

Figure 4:
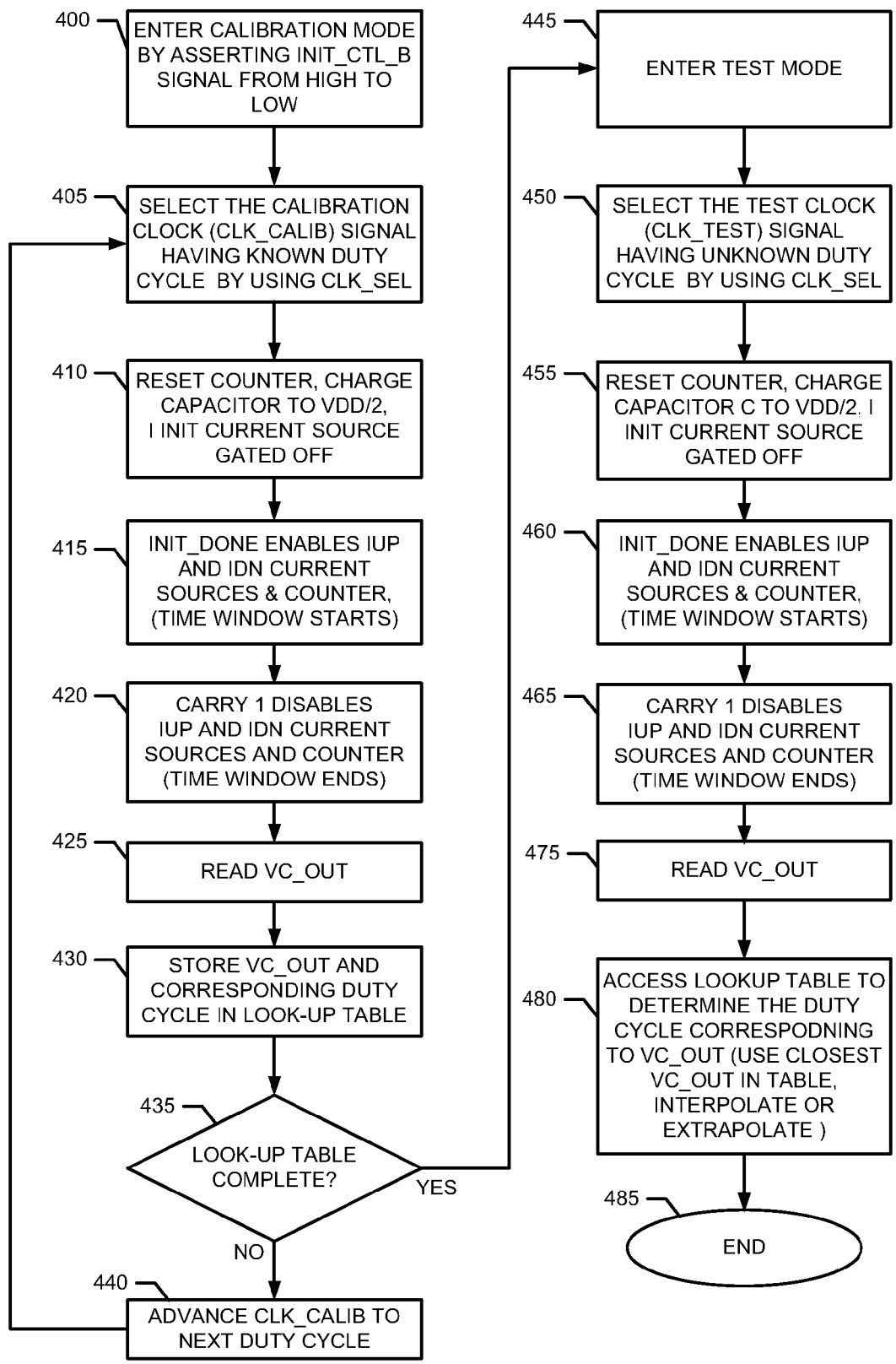
FIG. 4 shows a flowchart that describes steps in the methodology that control software or hardware employs in the IHS of FIG. 2.

FIG. 4 is a flowchart that depicts the methodology that DCM circuit 100 employs to measure the duty cycle of a binary digital signal such as a clock signal in IHS 200. In one embodiment, control software 217 controls the operation of IHS 200 and DCM circuit 100 as they carry out the steps set forth in the flowchart of FIG. 4. Alternatively, IHS 200 may include control hardware circuitry (not shown) to carry out the timing operations and functions of the flowchart of FIG. 4. DCM circuit 100 enters calibration mode at block 400 when IHS 200 asserts the INIT_CTL_B initialization signal from high to low at transition 300. In one embodiment, software 217 controls the generation of the INIT_CTL_B and INIT_DONE signals that govern the operation of DCM circuit 100 as per the methodology of the flowchart of FIG. 4. Control software 217 may also control the current mode of DCM circuit 100, namely instructing DCM circuit 100 to operate in either calibration mode or test mode. Alternatively, control circuitry (not shown) may also provide this control functionality. However, in the illustrated embodiment, software 217 controls the generation of the INIT_CTL_B signal consistent with the timing diagram of FIGS. 3A-3C. Control software 217 or control circuitry sends a CLK_SEL clock select signal to MUX 142 that instructs MUX 142 to select the CLK_CALIB clock calibration signal. MUX 142 then provides the CLK_CALIB signal to charge pump 102 as the CLK_IN signal, as per block 405. In other words, the CLK_SEL signal selects the CLK_CALIB signal, namely a clock signal that exhibits a known duty cycle and frequency. DCM circuit 100 then resets counter 140 to zero and charges capacitor 124 to a voltage value, VC, equal to VDD/2, as per block 410. Once the voltage on capacitor 124 reaches VDD/2, the control software 217 or control circuitry transitions the INIT_DONE signal from low to high at transition 305 to instruct the I INIT current source 134 to turn off and stop current source 134 from further charging capacitor 124, as per block 410.

Calibration mode continues with transition 305 of the INIT_DONE signal enabling the IUP and IDN current sources, as per block 415 once the voltage on capacitor 124 reaches the predetermined initialization voltage level, namely VDD/2, as per block 415. Transition 305 of the INIT_DONE signal also enables counter 140 which starts counting CLK_CALIB pulses thus marking the beginning of the time window (TW). Counter 140 counts clock pulses up to a predetermined number count which defines the end of the time window, TW. Throughout the duration of time window TW, the IUP and IDN current sources alternately source current into, and drain current from, capacitor 124. Time window TW ends when counter 140 reaches a predetermined count value that triggers the CARRY output of counter 140 to transition the TIME-UP signal at 310, as per block 420. The VC voltage value remaining at the end of time window TW passes through isolation buffer 112 and becomes the voltage VC_OUT. The VC_OUT voltage is the same as the VC voltage at node 122 after the buffering action of isolation buffer 112.

The control software 217 of IHS 200 reads the VC_OUT voltage value as per block 425. Control software 217 then stores that voltage value along with the already known duty cycle and frequency of the current CLK_CALIB signal as entries in look-up table 210, as per block 430. In one embodiment, control software 217 conducts calibration operations using CLK_CALIB signals exhibiting several different known duty cycles and frequencies. Control software 217 stores the resultant VC_OUT voltage value for each duty cycle/frequency combination in look-up table 210. A block 435 conducts a test to determine if IHS 200 already cycled through all of the known duty cycle/frequency combinations of the CLK_CALIB clock signal. Look-up table 210 may include an arbitrary number of entries of duty cycle, frequency and corresponding VC_OUT voltage. However, the greater the number of entries or data points that IHS 200 gathers in calibration mode, the more accurate the determination of the duty cycle becomes for a prospective test clock signal when IHS 200 switches from calibration mode to test mode. If the look-up table 210 is not yet complete, then IHS 200 advances to the next CLK_CALIB clock signal as per block 440. Process flow continues back to block 405. The process continues until decision block 435 determines that the look-up table 210 is complete.

When decision block 435 determines that the look-up table is complete, then DCM 100 enters test mode as per block 445. In test mode, DCM circuit 100 measures the duty cycle of an unknown duty cycle signal at test input 100A. Test mode is different from the above calibration mode wherein DCM circuit 100 calibrates itself by determining representative data points, VC_OUT, that IHS 200 gains from a plurality of different known duty cycle signals that DCM circuit 100 receives at input 100B. When DCM circuit 100 enters test mode, control software 217 or equivalent control hardware selects the CLK_TEST signal at MUX 142 by using the CLK_SEL signal to so indicate, as per block 450. Block 450 performs a selection function similar to block 405 discussed above, except that block 450 selects the unknown duty cycle signal. DCM circuit 100 then resets counter 140 and initializes the charge on capacitor 124 to a predetermined initial value of VDD/2, as per block 455. Block 455 exhibits the same function as block 410 discussed above. Blocks 460 and 465 respectively start the time window TW and end the time window TW in a manner similar to blocks 415 and 420. Thus, the test mode employs the same duration time window TW as the calibration mode. When time window TW ends at block 465, the control software 217 reads the current VC_OUT voltage at output 100C, as per block 475. Once software 217 acquires the VC_OUT voltage, software 217 accesses look-up table 210 and selects the stored VC_OUT voltage that is closest to the current VC_OUT voltage read by DCM circuit 100. In one embodiment, IHS 200 displays the duty cycle in look-up table 210 that most closely approximates the current VC_OUT voltage. This approach is most accurate when look-up table 210 includes a high number of data points, namely VC_OUT and corresponding duty cycle values and frequencies. In another embodiment, control software 210 may approximate the duty cycle of the current VC_OUT signal at output 100C by selecting the two closest VC_OUT voltage values to the current VC_OUT value and interpolating between the two corresponding duty cycles. This approach yields a highly accurate interpolated duty cycle value. The measurement method ends at end block 485.

Figure 5:
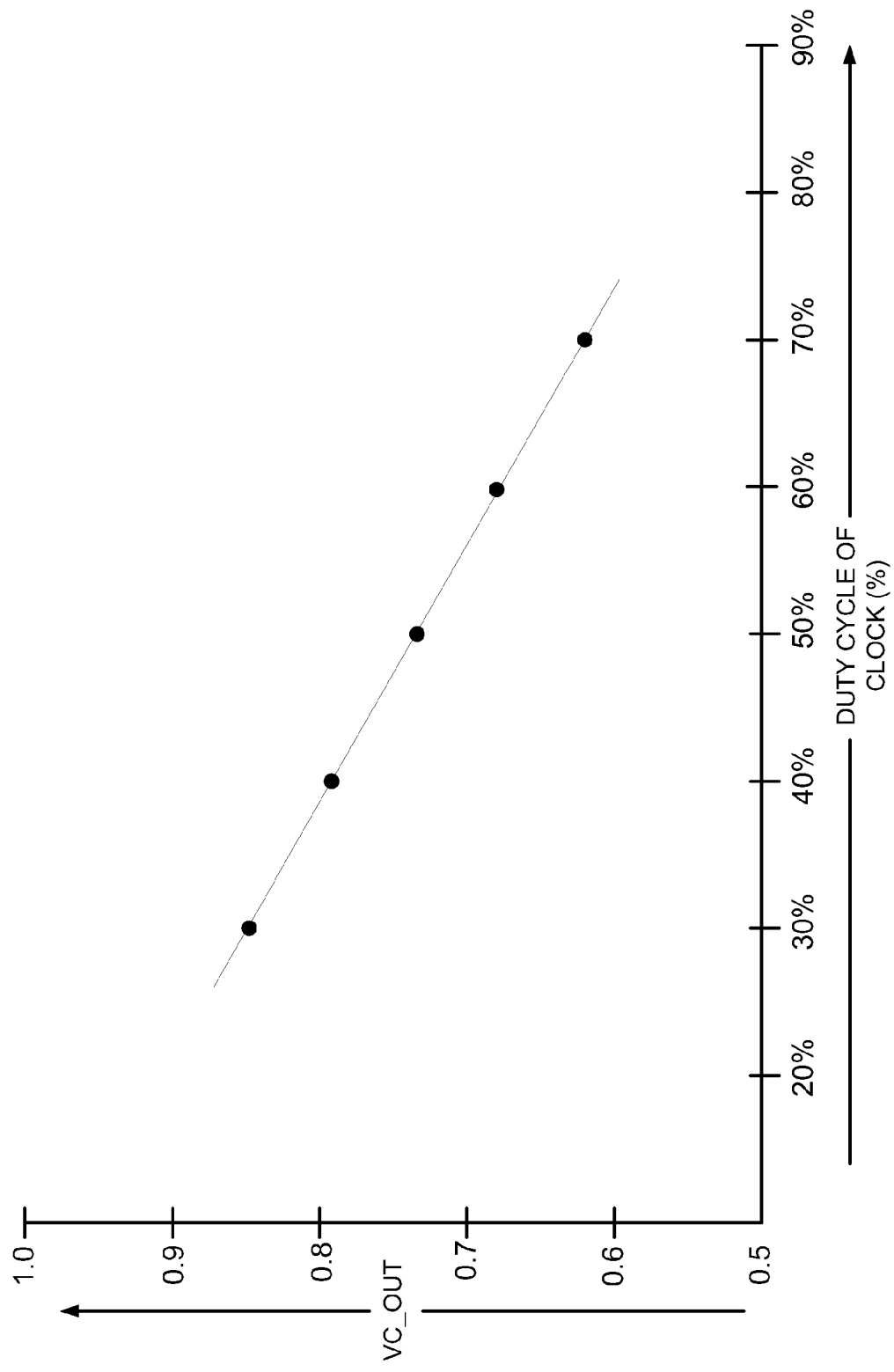
FIG. 5 shows a graph of the output voltage of the DCM apparatus of FIG. 1 at different duty cycle data values of a clock signal.

FIG. 5 is a representative graph of the VC_OUT voltage vs. the corresponding duty cycle at several data points. In this particular example, the time window is 50 nS, the current from the IUP and IDN current sources is 150 µA, and the capacitance of capacitor 124 is 24 pF. The observed VC_OUT voltage decreases linearly with increasing duty cycle of the CLK_IN signal. Stated alternatively, the observed VC_OUT voltage varies inversely with the increasing duty cycle of the CLK_IN signal. While in test mode, control software 217 receives the current VC_OUT voltage, accesses the graph of FIG. 5 via look-up table 210 and selects the duty cycle value that corresponds to the current VC_OUT voltage.

Figure 6:
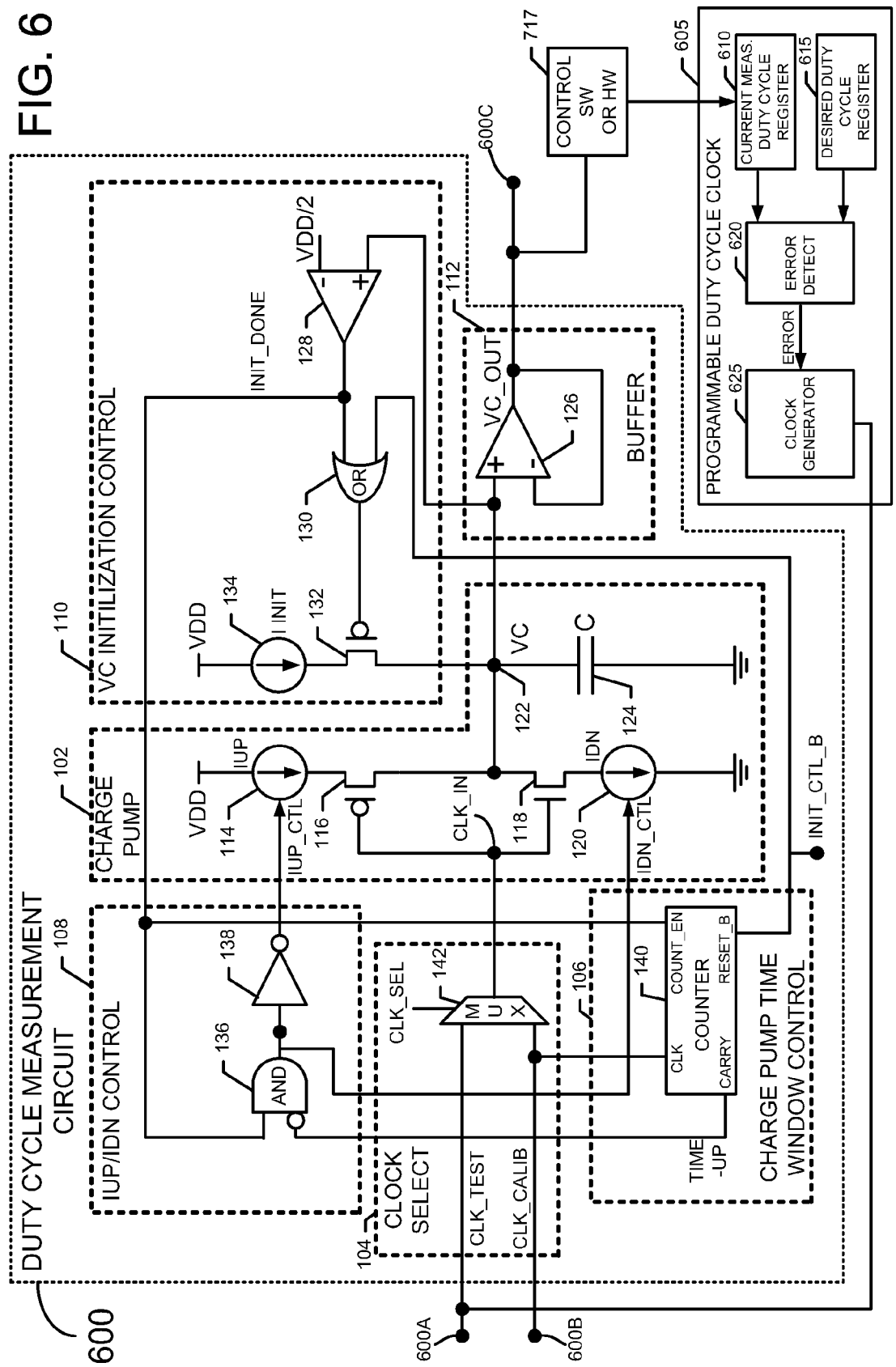
FIG. 6 shows a DCM circuit that employs a feedback mechanism to correct the duty cycle of a clock signal.

FIG. 6 is a block diagram of a duty cycle measurement (DCM) circuit 600 that operates in conjunction with a feedback mechanism to correct the duty cycle of a reference clock signal that a programmable duty cycle clock generator provides to DCM circuit 600. DCM circuit 600 is substantially the same as DCM circuit 100 of FIG. 1. Like numbers indicate like elements when comparing DCM circuit 600 with DCM circuit 100 of FIG. 1. As was the case with DCM circuit 100, the VC_OUT signal at output 600C of DCM circuit 600 provides an indication of the duty cycle of the current clock signal at input 600A.

Figure 7:
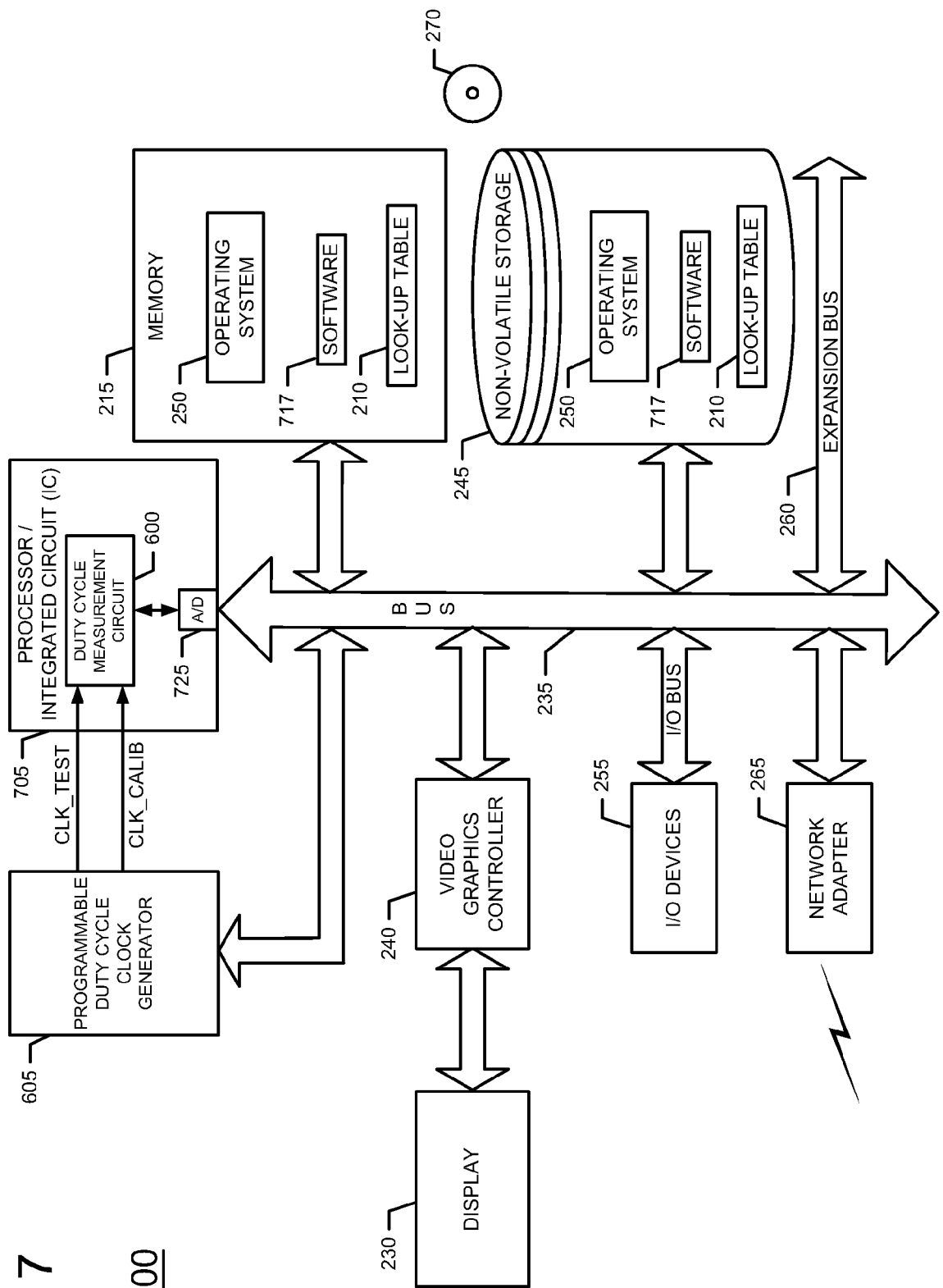
FIG. 7 shows an information handling system (IHS) embodiment that employs the disclosed DCM apparatus of FIG. 6.

FIG. 7 depicts an information handling system (IHS) 700 that incorporates a duty cycle measurement (DCM) circuit 600 to determine and adjust the duty cycle of a clock signal that programmable duty cycle clock generator 605 provides thereto. In the embodiment shown in FIG. 7, an integrated circuit (IC) 705 includes duty cycle measurement circuit 600 on a substrate or chip along with other functional block in a manner similar to integrated circuit 205 of FIG. 2. IC 705 may exhibit several different configurations such as a processor, microprocessor, microcontroller and virtually any digital logic circuit for which duty cycle measurement is desirable. In the particular embodiment shown in FIG. 7, IC 705 is a processor that functions in IHS 700 to measure the duty cycle of a test clock signal, CLK_TEST, that DCM circuit 600 receives. IHS 700 of FIG. 7 is similar to IHS 200 of FIG. 2. Like numbers indicate like elements when comparing IHS 700 with IHS 200.

Returning to FIG. 6, a programmable duty cycle clock generator circuit 605 couples to DCM circuit 600 as shown. Control software 717 or equivalent control hardware controls the operation and timing of DCM circuit 600 in a manner similar to that of control software 217 of FIG. 2. More specifically, control software 717 operates in cooperation with IHS 700 of FIG. 7 to control the calibration of DCM circuit 600 in a manner similar to the way software 217 controls the calibration of DCM circuit 100 of FIG. 2. Control software 717 also controls the measurement of the duty cycle of the CLK_TEST signal that programmable duty cycle clock generator 605 provides to input 600A. In the embodiment shown in FIGS. 6 and 7, control software 717 cooperates with programmable duty cycle clock generator 605 to vary and correct error in the duty cycle of the clock signal that clock generator 605 provides to DCM circuit 600. More particularly, DCM circuit 600 employs control software 717 and programmable clock generator 605 as a feedback mechanism to adjust or vary the duty cycle of the clock signal until the duty cycle of the clock signal equals or approximately equals a predetermined desired duty cycle value.

Control software 717 works in conjunction with the remaining functional blocks of IHS 700 to provide the current measured duty cycle of the CLK_TEST signal to a current measured duty cycle register 610 in programmable clock generator 605 shown in FIG. 6. Register 610 thus stores the measured duty cycle of the current clock signal, CLK_TEST, that programmable clock generator 605 provides to input 600A of DCM circuit 600. A register 615 stores the desired duty cycle for the CLK_TEST signal. A test operator may programmably enter the desired duty cycle value, for example 50%, into desired duty cycle register 615. An error detector 620, for example a comparator circuit, then compares the measured duty cycle from register 610 with the desired duty cycle from register 610. In response, error detector 620 generates an error signal that indicates the extent to which the current measured duty cycle varies from the desired duty cycle. In response to the error signal, programmable clock generator 620 varies the duty cycle of the clock signal that it generates to decrease the difference between the actual measured duty cycle and the desired duty cycle. After this adjustment of the clock duty cycle, DCM circuit 600 then measures the current duty cycle again. Control software 717 and programmable clock generator 605 then adjust the duty cycle of the clock signal CLK_TEST further if any difference between the duty cycle of the measured clock and the duty cycle of the desired clock remains. In this manner, IHS 700 provides a feedback mechanism that drives any duty cycle error between the actual measured clock and the desired clock substantially to zero or a very small value.

IC 705 of FIG. 7 includes an A/D converter 725 that operates in a manner similar to A/D converter 225 of FIG. 2 to convert the VC_OUT voltage to a digital value that control software 717 employs. In this manner, IC 705 and DCM circuit 600 provide duty cycle information to control software 717.

Figure 8:
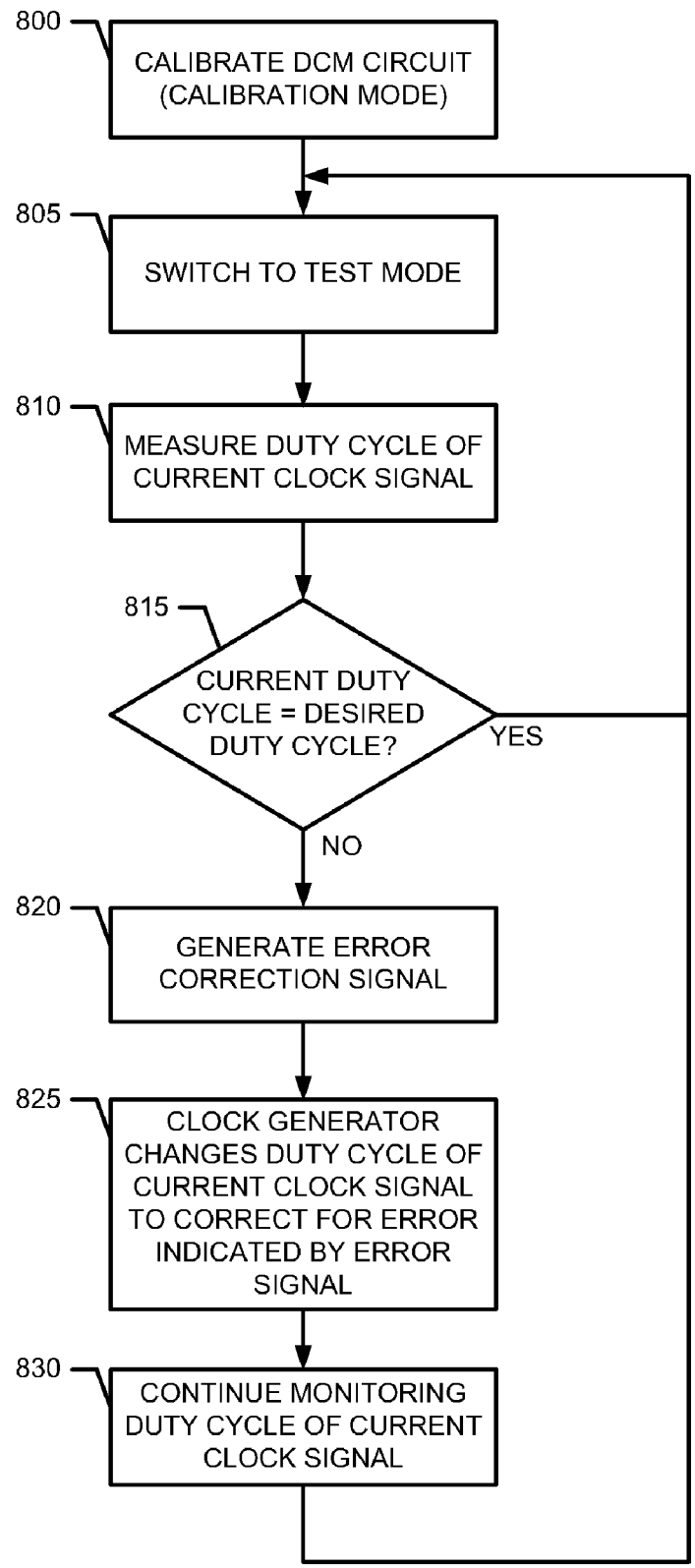
FIG. 8 shows a flowchart that describes steps in the methodology that control software or hardware employs in the IHS of FIG. 7.

FIG. 8 shows a flowchart that depicts operation of duty cycle measurement (DCM) circuit 600 as controlled by control software 717. As per block 800, DCM circuit 600 initially operates in calibration mode to establish VC_OUT data points and corresponding duty cycle values in a manner similar to blocks 400-440 of the FIG. 4 flowchart. As per block 805, control software 717 then switches DCM circuit 600 to test mode. DCM circuit 600 then measures the current duty cycle of the clock signal that programmable duty cycle clock generator circuit 605 supplies to input 600A, as per block 810. The error detector 620 in programmable duty cycle clock generator 605 then compares the current measured duty cycle to the desired duty cycle, as per decision block 815. More particularly, error detector 620 performs a test to determine if the current measured duty cycle equals the desired duty cycle. If the current measured duty cycle equals the desired duty cycle, then process flow continues back to block 805 from which further testing continues to assure there is no error or minimal error. However, if decision block 815 determines that the current measured duty cycle does not equal the desired duty cycle, then error detector 620 generates an error signal indicating the amount of the error, as per block 820. In response, clock generator circuit 625 in programmable duty cycle clock generator 605 changes the duty cycle of the current clock signal to correct for the amount of error indicated by the error signal, as per block 825 Error detector 620 continues monitoring the new current measured duty cycle to see if the error now equals zero, namely that the current measured duty cycle equals or approximately equals the desired duty cycle, as per block 830. Process flow continues back to block 805 to provide continuous error monitoring and feedback should an error condition occur. In this manner, programmable duty cycle clock generator 605 operating in conjunction with control software provides a feedback mechanism that drives the error between the current measured duty cycle of the test clock signal and the desired duty cycle substantially to zero or a minimal value. In one embodiment, control software 717 may include the storage functions of current duty cycle register 615 and desired duty cycle register 610. Moreover, control software 717 may also include the error detection function of error detector 620. In such an embodiment, control software 717 provides an error signal to clock generator 625 to control the duty cycle of the output clock signal that clock generator 625 generates. Moreover, control software 717 may also control the storage of VC_OUT values and corresponding duty cycles and frequencies in lookup table 210 as FIG. 7 depicts.

Those skilled in the art will appreciate that the various structures disclosed, such as control application 217, control application 717, look-up table (LUT) 210, current measurement duty cycle register 610, desired duty cycle register 615 can be implemented in hardware or software. Moreover, the methodology represented by the blocks of the flowcharts of FIGS. 4 and 8 may be embodied in a computer program product, such as a media disk, media drive or other media storage.

In one embodiment, the disclosed methodology is implemented as an application, namely a set of instructions (program code) in a code module which may, for example, be resident in a system memory 215 of IHS 200 of FIG. 2 or IHS 700 of FIG. 7. Until required by processor 205 or 705, the set of instructions may be stored in another memory, for example, non-volatile storage 245 such as a hard disk drive, or in a removable memory such as an optical disk or floppy disk 270, or downloaded via the Internet or other computer network. Thus, the disclosed methodology may be implemented in a computer program product for use in a computer such as IHS 200 or IHS 700. It is noted that in such a software embodiment, code which carries out the functions of control software 717 or other system functions may be stored in system memory 215 while processor 705 executes such code. In addition, although the various methods described are conveniently implemented in a general purpose computer selectively activated or reconfigured by software, one of ordinary skill in the art would also recognize that such methods may be carried out in hardware, in firmware, or in more specialized apparatus constructed to perform the required method steps.

The foregoing discloses an information handling system (IHS) that in one embodiment measures the duty cycle of digital signals such as clock signals. In another embodiment, the IHS both measures and corrects the duty cycle of digital signals such as clock signals.

Modifications and alternative embodiments of this invention will be apparent to those skilled in the art in view of this description of the invention. Accordingly, this description teaches those skilled in the art the manner of carrying out the invention and is intended to be construed as illustrative only. The forms of the invention shown and described constitute the present embodiments. Persons skilled in the art may make various changes in the shape, size and arrangement of parts. For example, persons skilled in the art may substitute equivalent elements for the elements illustrated and described here. Moreover, persons skilled in the art after having the benefit of this description of the invention may use certain features of the invention independently of the use of other features, without departing from the scope of the invention.

What is claimed is:

1. A method of calibrating a duty cycle measurement (DCM) circuit for determining the duty cycle of a digital signal, the method comprising:

supplying the digital signal to the duty cycle measurement (DCM) circuit, the DCM circuit being situated on an integrated circuit (IC) that includes a capacitor;

charging, by charger circuitry in the DCM circuit, the capacitor to a voltage value that depends on the duty cycle of the digital signal;

varying the duty cycle of the digital signal to a plurality of different duty cycle values, the digital signal charging the capacitor to a different voltage value for each of the duty cycle values thereof; and storing, in a data store, each voltage value and the corresponding duty cycle value wherein the digital signal includes a plurality of pulses, each pulse including first and second logic states, the charging circuit charging the capacitor up during the first logic states of the pulses, the charging circuit discharging the capacitor during the second logic state of the pulses, the first and second logic states exhibiting respective durations that define the duty cycle of a particular digital signal, thus leaving a voltage value on the capacitor related to the duty cycle of the plurality of pulses.

2. The method of claim 1, wherein the supplying step comprises supplying, by a reference clock circuit, the digital signal to the DCM circuit.

3. The method of claim 1, wherein the charging step comprises charging, by a charge pump in the charger circuitry, the capacitor.

4. The method of claim 1, wherein the storing step comprises storing a look-up table in the data store, the look-up table including a plurality of capacitor voltage values and a respective plurality of duty cycle values.

5. The method of claim 4, wherein the plurality of voltage values vary linearly with the respective plurality of duty cycle values.

6. A method of determining the duty cycle of a digital signal, the method comprising:

supplying a first digital signal to a duty cycle measurement (DCM) circuit situated on an integrated circuit (IC) that includes a capacitor;

charging, by charger circuitry in the DCM circuit, the capacitor to a voltage value that depends on the duty cycle of the first digital signal;

varying the duty cycle of the first digital signal to a plurality of different known duty cycle values, the first digital signal charging the capacitor to a different voltage value for each of the known duty cycle values thereof;

storing, in a data store, each voltage value and the corresponding known duty cycle value;

supplying a second digital signal to the DCM circuit, the second digital signal exhibiting an unknown duty cycle;

charging, by the charger circuitry, the capacitor with the second digital signal to a voltage value corresponding to the unknown duty cycle of the second digital signal; and accessing the data store to determine to which duty cycle the voltage value of the second digital signal corresponds.

7. The method of claim 6, further comprising interpolating the known duty cycle values and corresponding voltage values in the data store to determine the duty cycle to which the voltage value of the second digital signal corresponds.

8. The method of claim 6, further comprising extrapolating from the known duty cycle values and corresponding voltage values in the data store to determine the duty cycle to which the voltage value of the second digital signal corresponds.

9. The method of claim 6, wherein the supplying step comprises supplying, by a reference clock circuit, the first digital signal to the DCM circuit.

10. The method of claim 6, wherein the charging step comprises charging, by a charge pump in the charger circuitry, the capacitor.

11. The method of claim 6, wherein the first digital signal includes a plurality of pulses, each pulse including first and second logic states, the charging circuit charging the capacitor up during the first logic states of the pulses, the charging circuit discharging the capacitor during the second logic state of the pulses, the first and second logic states exhibiting respective durations that define the duty cycle of a particular first digital signal, thus leaving a voltage value on the capacitor related to the duty cycle of the plurality of pulses.

12. The method of claim 6, wherein the storing step comprises storing a look-up table in the data store, the look-up table including a plurality of capacitor voltage values and a respective plurality of duty cycle values.

13. The method of claim 12, wherein the plurality of voltage values vary linearly with the respective plurality of duty cycle values.

* * * * *